US005654571A

United States Patent [19]
Tsuji

[11] Patent Number: 5,654,571
[45] Date of Patent: Aug. 5, 1997

[54] SEMICONDUCTOR DEVICE

[75] Inventor: Nobuaki Tsuji, Hamamatsu, Japan

[73] Assignee: Yamaha Corporation, Hamamatsu, Japan

[21] Appl. No.: 325,741

[22] Filed: Oct. 19, 1994

[30] Foreign Application Priority Data

Oct. 22, 1993 [JP] Japan ................................. 5-287809

[51] Int. Cl.$^6$ ............... H01L 23/62; H01L 27/01; H01L 27/12
[52] U.S. Cl. ................ 257/357; 257/354; 257/360
[58] Field of Search ................. 257/357, 360, 257/354

[56] References Cited

U.S. PATENT DOCUMENTS

| | | | |
|---|---|---|---|
| 4,930,037 | 5/1990 | Woo | 257/357 |
| 4,989,057 | 1/1991 | Lu | 257/357 |
| 5,285,095 | 2/1994 | Toyoda | 257/357 |
| 5,440,162 | 8/1995 | Worley et al. | 257/355 |

FOREIGN PATENT DOCUMENTS 63-95667  4/1988  Japan .

Primary Examiner—Stephen Meier
Attorney, Agent, or Firm—Loeb & Loeb LLP

[57] ABSTRACT

A semiconductor device, such as a MOS integrated circuit, provides an internal circuit whose primary stage is configured by an inverter circuit consisting of p-channel and n-channel MOS transistors. The sources of the MOS transistors are connected with a first pair of power-supply terminals respectively, while the gates of the MOS transistors are connected together to form a common gate terminal to which a voltage input applied to an input is terminal. The MOS integrated circuit provides first and second input protection circuits which are connected together between the input terminal and common gate terminal. The first input protection circuit is connected with a second pair of power-supply terminals which is provided independently of the first pair of power-supply terminals. When an abnormal voltage input is applied to the input terminal, the first input protection circuit is activated to perform a voltage clamping by releasing an electric current. If the abnormal voltage input is a sharp surge-pulse input, the second input protection circuit is activated as well so that a potential variation at the common gate terminal, which is caused by the abnormal voltage input, is followed by a potential variation at the first pair of power-supply terminals. Hence, a difference in voltage between the potential at the common gate terminal and the source of the MOS transistor in the internal circuit is reduced. Therefore, destruction or deterioration of the gate of the MOS transistor in the internal circuit is avoided.

8 Claims, 3 Drawing Sheets

SEMICONDUCTOR DEVICE

BACKGROUND OF THE INVENTION

The present invention relates to a semiconductor device, and particularly to a MOS integrated circuit which comprises an input protection circuit in order to prevent a destruction even from occurring on the gate of the MOS transistor.

The MOS integrated circuit normally provides an input protection circuit in order to prevent a destruction event from occurring on the gate of the MOS transistor, wherein the MOS transistor is located at the primary stage of the internal circuit which is provided inside of the MOS integrated circuit. A destruction event is caused by static electricity or abnormal voltage input such as excessive voltage which is applied to the MOS integrated circuit by mistake. The input protection circuit acts as the protection circuit which performs voltage clamping by releasing an electric current against the abnormal voltage input so as to avoid an event in which the relatively large voltage is applied to the gate of the MOS transistor. The input protection circuit can be realized simply by a diode (or diodes) by which the voltage clamping is performed against the positive or negative abnormal voltage input. The input protection circuit can also be configured by a MOS transistor (or MOS transistors). In that MOS transistor, a parasitic component (e.g., parasitic diode or parasitic bipolar transistor) is turned on responsive to the abnormal voltage input. Hence, by using this property of the parasitic component provided in the MOS transistor, the electric current is released in response to the abnormal voltage input.

The input protection circuit described above cannot protect the MOS integrated circuit sufficiently against the abnormal voltage input if it is like a surge-voltage input, as shown in FIG. 6, whose level sharply rises and whose pulse width only corresponds to a few nano seconds. This is because the input protection circuit has a limit in high-speed response. Specifically, in the transient state where some electric component is turned on so that the electric current is released, the voltage-clamping function cannot work; hence, in some cases, a potential increase at the gate of the MOS transistor cannot be avoided. If this transient gate-potential increase exceeds a certain level, destruction is initiated on the oxide film of the gate of the MOS transistor.

SUMMARY OF THE INVENTION

It is an object of the present invention to provide a semiconductor device with an input protection circuit which is capable of effectively protecting the gate of the MOS transistor against the destruction caused by the abnormal voltage input such as a sharp surge-pulse input.

The present invention fundamentally relates to a semiconductor device, such as a MOS integrated circuit, providing an internal circuit whose primary stage is configured by an inverter circuit consisting of p-channel and n-channel MOS transistors. The sources of the MOS transistors are connected with a first pair of power-supply terminals respectively, while the gates of the MOS transistors are connected together to form a common gate terminal to which a voltage input is applied to an input terminal. The present invention is characterized by comprising first and second input protection circuits which are connected together between the input terminal and common gate terminal. The first input protection circuit is connected together with a second pair of power-supply terminals which is provided independently of the first pair of power-supply terminals. When an abnormal voltage input is applied to the input terminal, the first input protection circuit is activated to perform a voltage clamping by releasing an electric current. If the abnormal voltage input is a sharp surge-pulse input, the second input protection circuit is activated as well so that a potential variation at the common gate terminal, which is caused by the abnormal voltage input, is followed by a potential variation at the first pair of power-supply terminals. Hence, a difference between the potential at the common gate terminal and the source of the MOS transistor in the internal circuit is reduced. Therefore, destruction or deterioration of the gate of the MOS transistor in the internal circuit can be avoided. Preferably, the second input protection circuit is configured by using a zener diode because the zener diode has a superior high-speed response and can respond to the sharp surge-pulse input.

BRIEF DESCRIPTION OF THE DRAWINGS

Further objects and advantages of the present invention will be apparent from the following description and by referring to the accompanying drawings wherein the preferred embodiments of the present invention are clearly shown.

In the drawings.

DESCRIPTION OF THE PREFERRED EMBODIMENTS

Figure 1:
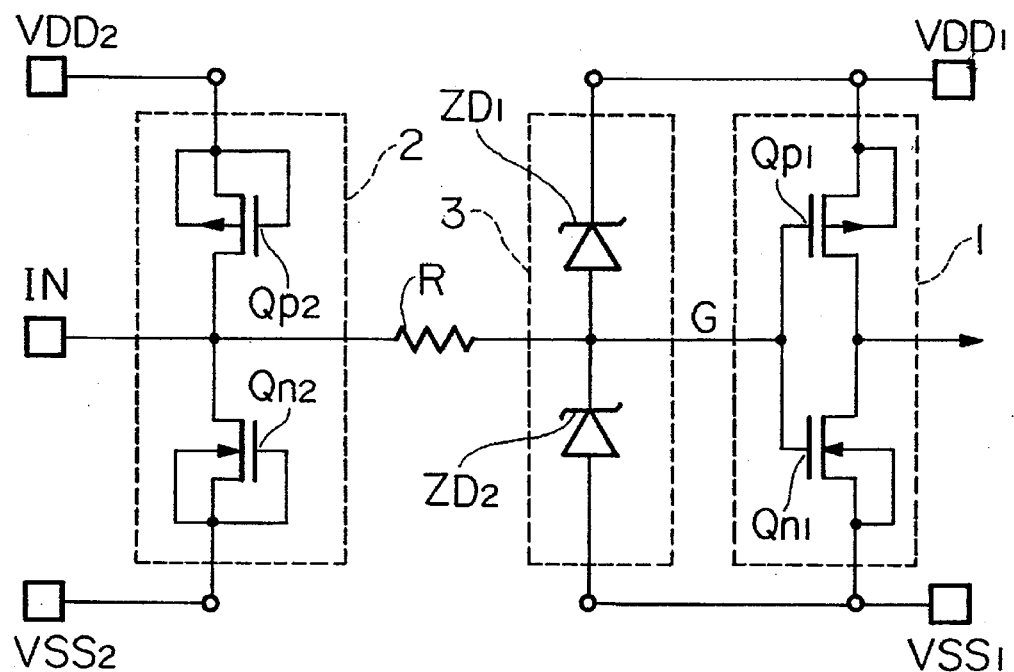
FIG. 1 is a circuit diagram showing a detailed configuration for a MOS integrated circuit which is an embodiment of the present invention.

FIG. 1 is a circuit diagram showing a detailed configuration for input protection circuits provided in the MOS integrated circuit which is an embodiment of the present invention. A primary-stage inverter circuit 1, which is a part of the internal circuit of the MOS integrated circuit, is configured by a CMOS inverter (where 'CMOS' is an abbreviation for complementary metal-oxide semiconductor) consisting of a p-channel MOS transistor Qp1 and an n-channel MOS transistor Qn1. The source of the MOS transistor Qp1 (specifically a connection point between the source and bulk of the MOS transistor Qp1) is connected to a positive power-supply terminal $VDD_1$, while the source of the MOS transistor Qn1 (specifically a connection point between the source and bulk of the MOS transistor Qn1) is connected to a negative power-supply terminal $VSS_1$. The gates of those NOS transistors are connected together with a common gate terminal G which is also connected to an external-signal input terminal 'IN' through an input resistor R.

In order to protect the primary-stage inverter circuit 1, there are provided two protection circuits, i.e., a first input protection circuit 2 and a second input protection circuit 3.

The first input protection circuit 2 is connected with a positive power-supply terminal $VDD_2$ and a negative power-supply terminal $VSS_1$ which are provided independently of the aforementioned power-supply terminals $VDD_1$ and $VSS_1$. The first input protection circuit 2 consists of a p-channel MOS transistor Qp2 and an n-channel MOS transistor Qn2 which are connected in series between the power-supply terminals $VDD_2$ and $VSS_2$. In each MOS transistor, the gate, source and bulk are connected together and are connected to the power-supply terminal $VDD_2$ or $VSS_2$. Thus, each MOS transistor acts like a diode. The drains of the MOS transistors are connected together and are commonly connected to the external-signal input terminal IN.

The second input protection circuit 3 consists of zener diodes $ZD_1$ and $ZD_2$ which are connected together in a forward-bias direction between the power-supply terminals $VSS_1$ and $VDD_1$. A connection point between the zener diodes $ZD_1$ and $ZD_2$ is connected with the aforementioned common gate terminal G of the primary-stage inverter circuit 1 and is also connected to the external-signal input terminal IN through the input resistor R. Hence, the first and second input protection circuits 2 and 3 are connected together through the input resistor R.

Figure 3:
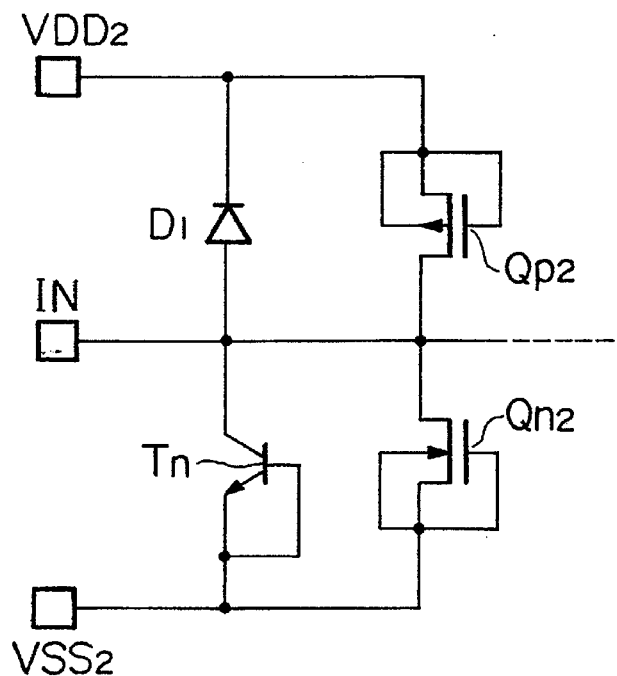
FIG. 3 is a circuit diagram showing an equivalent circuit of a first input protection circuit in connection with the positive abnormal voltage input.

When the first input protection circuit 2 receives the abnormal voltage input whose level exceeds a voltage limit of the gate of the MOS transistor provided in the primary-stage inverter circuit 1, the parasitic component thereof work to release the electric current. When considering the action of the parasitic component against the positive abnormal voltage input, the first input protection circuit 2 can be replaced by an equivalent circuit as shown in FIG. 3. In that case, a p-n junction diode D1 is formed between the drain (p) and bulk (n) of the p-channel MOS transistor Qp2 and this diode is connected in parallel with the MOS transistor Qp2 as the parasitic component. In addition, an n-p-n transistor Tn is formed between the drain (n), bulk (p) and source (n) of the n-channel MOS transistor Qn2; and this transistor Tn is connected in parallel with the MOS transistor Qn2 as the parasitic component while the base and emitter thereof are connected together.

Figure 5:
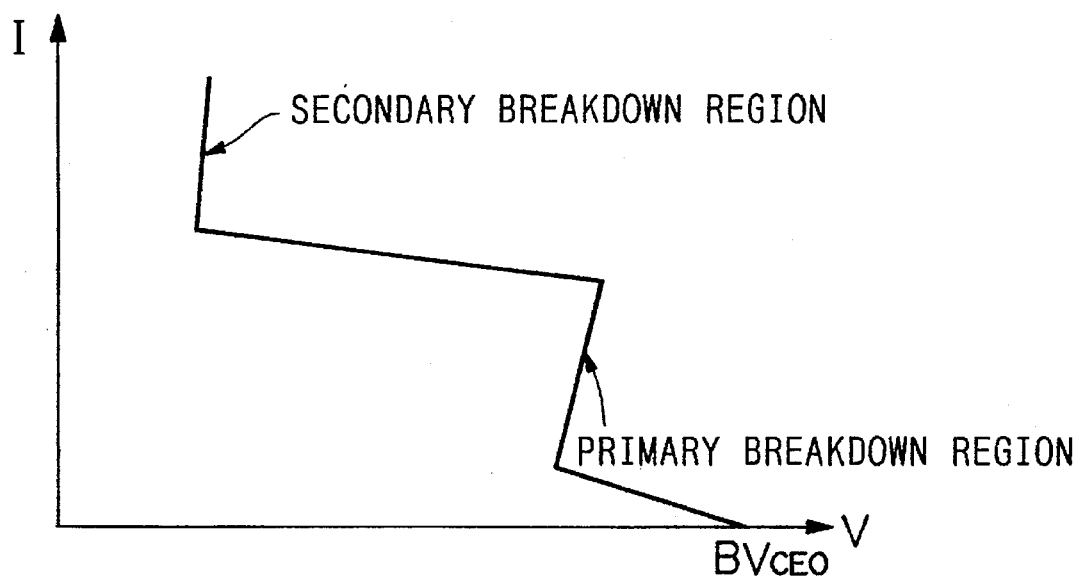
FIG. 5 is a graph showing a voltage-current characteristic of a parasitic bipolar transistor.
Figure 6:
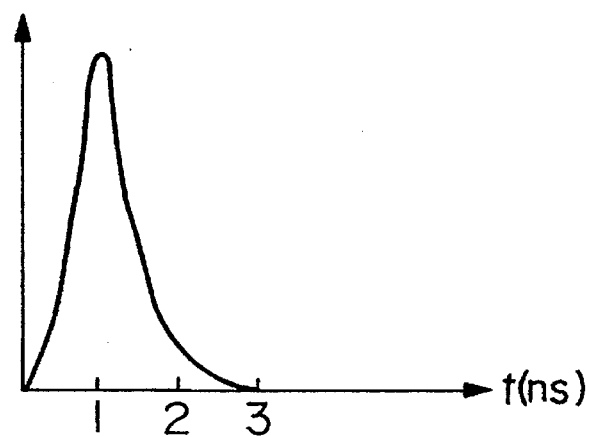
FIG. 6 is graph showing an example of a waveform of a sharp surge-pulse input.

When the positive abnormal voltage input is applied to the external-signal input terminal IN, the parasitic diode D1 or the parasitic transistor Tn is turned on so that the electric current is released to the power-supply terminal $VDD_2$ or $VSS_2$. The parasitic transistor Tn is forced to be turned on without initiating the base-drive operation thereof. In general, there is a limit in the voltage which can be applied between the collector and emitter of the transistor when the base is open; and this limit in voltage is called a collector-emitter voltage limit ($BV_{CEO}$). When the transistor Tn, in which the base and emitter are connected together, receives a relatively large voltage which is larger than the collector-emitter voltage limit, the voltage-current characteristic, as shown by a graph of FIG. 5, is established. In FIG. 5, the voltage-current characteristic curve has a primary breakdown region (i.e., snapback region) and a secondary breakdown region. The present embodiment is designed to perform the voltage clamping by using the primary breakdown region of the characteristic curve shown in FIG. 5.

Figure 4:
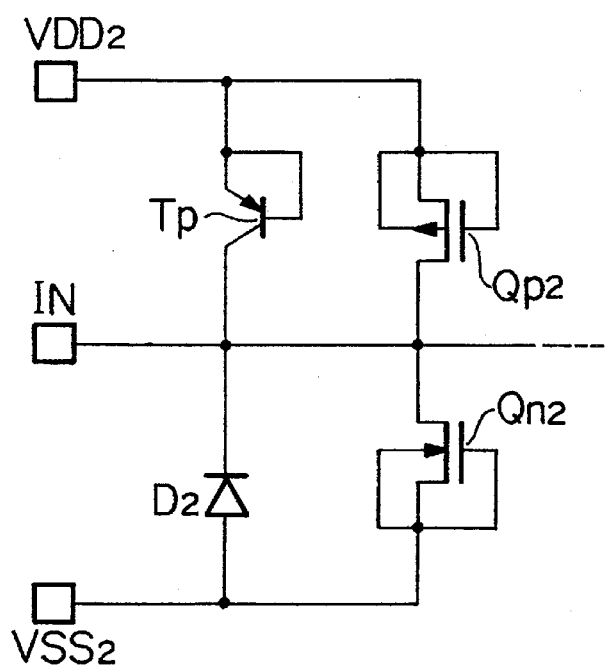
FIG. 4 is a circuit diagram showing an equivalent circuit of the first input protection circuit in connection with the negative abnormal voltage input.

When considering the action of the parasitic component against the negative abnormal voltage input, the first input protection circuit 2 can be replaced by an equivalent circuit as shown in FIG. 4. The circuit configuration of FIG. 4 is reverse to that of FIG. 3. Specifically, a p-n junction diode D2 is formed between the drain (n) and bulk (p) of the n-channel MOS transistor Qn2; and this diode D2 is connected in parallel with the MOS transistor Qn2 as the parasitic component. In addition, a p-n-p transistor Tp is formed between the drain (p), bulk (n) and source (p) of the p-channel MOS transistor Qp2; and this transistor Tp is connected in parallel with the MOS transistor Qp2 as the parasitic component while the base and emitter thereof are connected together. Similar to the circuitry shown in FIG. 3, the circuitry shown in FIG. 4 performs the voltage clamping by releasing the electric current which is released when each of the parasitic components is turned on responsive to the negative abnormal voltage input.

When the first input protection circuit 2 operates responsive to the abnormal voltage input, a potential variation occurs transiently at each of the power-supply terminals $VDD_2$ and $VSS_2$. In the case of the positive abnormal voltage input, electric currents are respectively flown into the power-supply terminals $VDD_2$ and $VSS_2$; hence, their potentials are increased. In the case of the negative abnormal voltage input, electric currents are flown respectively from the power-supply terminals $VDD_2$ and $VSS_2$; hence, their potentials are decreased. The above-mentioned transient potential variation at the power-supply terminals $VDD_2$ and $VSS_2$, which is caused by the electric currents to be flown into or flown from those terminals, does not affect the power-supply terminals $VDD_1$ and $VSS_1$ which are provided for the internal circuit of the MOS integrated circuit shown in FIG. 1. Because, the power-supply terminals $VDD_1$ and $VSS_1$ are provided independently of the power-supply terminals $VDD_2$ and $VSS_2$. Therefore, it is possible to avoid bad effects to the internal circuit, such as the source-contact destruction or gate destruction in the MOS transistor and a latch-up event to be occurred due to the noise currents, wherein those bad effects are caused by the electric currents which are flown into the source of the MOS transistor provided inside of the internal circuit when the operation of the first input protection circuit 2 is initiated.

Particularly, in the case where the internal circuit is made by micro-electronic components which are manufactured in accordance with sub-micron rules or the like, the potential variation may easily result in the gate destruction. As for the CMOS circuit, the latch-up event easily occurs. So, the present embodiment has a great advantage because the occurrence of the above-mentioned bad effects can be easily avoided by using a different power supply for each of the first protection circuit 2 and the internal circuit.

If the abnormal voltage input to be applied to the external-signal input terminal IN is the sharp surge-pulse input, the first input protection circuit 2 cannot sufficiently absorb it. In that case, the potential variation due to the sharp surge-pulse input may be transiently transmitted to the common gate terminal G of the primary-stage inverter circuit 1 through the input resistor R. Hence, the second input protection circuit 3 is activated to prevent the gates of the MOS transistors Qp1 and Qn1 from being destructed. Because, the potential variation due to the sharp surge-pulse input results in a transient potential variation at the common gate terminal G, so that the zener diodes $ZD_1$ and $ZD_2$ in the second input protection circuit 3 are turned on. When the zener diodes $ZD_1$ and $ZD_2$ are turned on, the potential variation at the common gate terminal G follows on a potential variation at the power-supply terminals $VDD_1$ and $VSS_1$ which are provided for the internal circuit.

For example, when the potential at the common gate terminal G is increased by the positive surge-pulse input, the zener diode $ZD_1$ is forward biased and is turned on, so that the potential at the power-supply terminal $VDD_1$ is increased. The present embodiment is designed such that although an increase of potential occurs at the common gate terminal G when the positive surge-pulse input is applied to the external-signal input terminal IN, the voltage, which is measured between the gate and the connection point between the source and bulk in connection with the p-channel MOS transistor Qp1, is not increased because of the operation of the second input protection circuit 3, as compared to the circuitry in which the second input protection circuit 3 is not provided so that the potential at the power-supply terminal $VDD_1$ is not increased responsive to the positive surge-pulse input. If the above-mentioned voltage is less than the gate destructive voltage or gate deteriorative voltage, the destruction or deterioration of the gate of the MOS transistor Qp1 can be avoided.

When a difference in voltage between the potential at the common gate terminal G and the potential at the power-supply terminal $VSS_1$ exceeds the zener voltage, the zener diode $ZD_2$ is turned on, so that an increase of potential occurs at the power-supply terminal $VSS_1$. Thus, as similar to the aforementioned case of the p-channel MOS transistor Qp1, the destruction or deterioration of the gate of the n-channel MOS transistor Qn1 can be avoided.

A relationship between the zener diodes $ZD_1$ and $ZD_2$, by which either $ZD_1$ or $ZD_2$ is forced to be turned on firstly, depends upon a relationship between the potentials which are actually and respectively applied to the power-supply terminals $VDD_1$ and VSS.

Similar to the foregoing case of the positive surge-pulse input, when the negative surge-pulse input is applied to the external-signal input terminal IN, a potential variation (i.e., potential reduction) occurs at the common gate terminal G. This potential variation caused by the negative surge-pulse input affects the potential at the power-supply terminal $VSS_1$ which is normally grounded. In this case, when the zener diode $ZD_2$ is forward biased and is turned on, the potential reduction at the common gate terminal G follows on a potential reduction at the power-supply terminal $VSS_1$. If the potential reduction at the common gate terminal G is relatively large so that a difference in voltage between the potential at the common gate terminal G and the potential at the power-supply terminal $VDD_1$ exceeds the zener voltage, the zener diode $ZD_1$ is turned on so that the potential at the power-supply terminal $VDD_1$ is reduced. Thus, destruction or deterioration occurring on the gates of the MOS transistors Qp1 and Qn1 can be avoided.

As described heretofore, if the abnormal voltage input is not so sharp, only the first input protection circuit 2 is activated so that the voltage clamping is performed without causing a potential variation at the power-supply terminals $VDD_1$ and $VSS_1$ which are provided for the internal circuit. If the abnormal voltage input is the sharp surge-pulse input which cannot be absorbed by the first input protection circuit 2 only, the second input protection circuit 3, which is connected with the first protection circuit 2 by means of the input resistor R, is activated as well so that the gate destruction in the MOS transistor provided in the primary-stage inverter circuit 1 can be avoided. Particularly, the present embodiment uses the zener diodes for the second input protection circuit 3 because the zener diode is advantageous in the high-speed response. Therefore, a sharp potential variation in nano-second order at the gate of the MOS transistor can be followed by the potential variation at the power-supply terminal $VDD_1$ or $VSS_1$; hence, a superior protection can be guaranteed for the MOS transistor against the abnormal voltage input.

Figure 2:
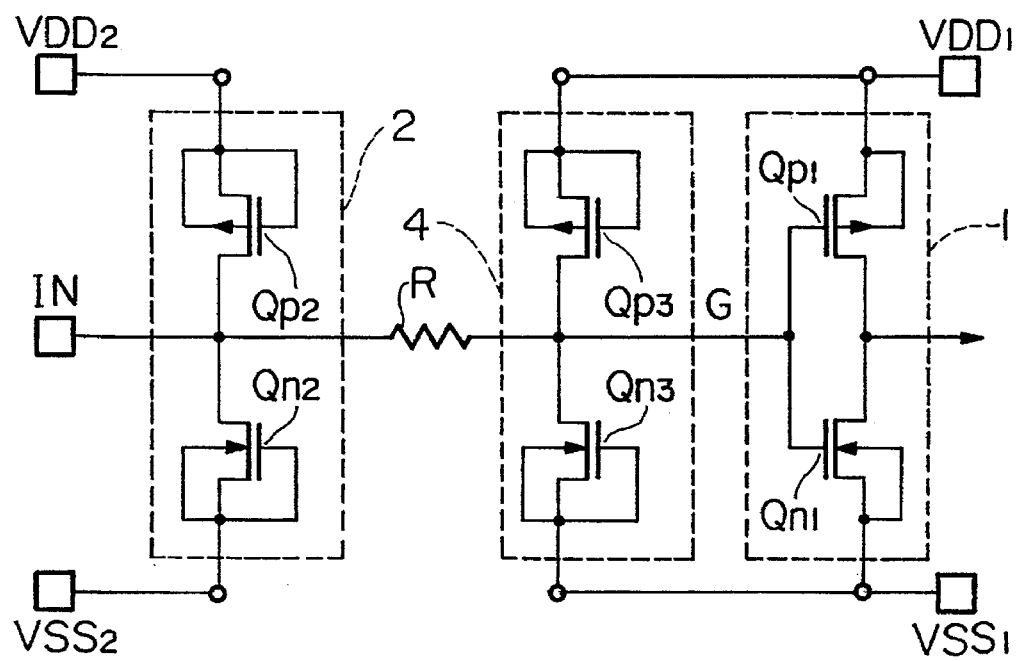
FIG. 2 is a circuit diagram showing a detailed configuration for another MOS integrated circuit which is another embodiment of the present invention.

FIG. 2 shows a detailed configuration for input protection circuits provided in a MOS integrated circuit which is another embodiment of the present invention. In FIG. 2, the parts corresponding to those shown in FIG. 1 will be designated by the same numerals; hence, the detailed description thereof will be omitted. As compared to the foregoing embodiment shown in FIG. 1, the present embodiment shown in FIG. 2 is characterized by a configuration of a second input protection circuit 4 which is provided instead of the foregoing circuit 3. The second input protection circuit 4 has a similar configuration to that of the first input protection circuit 2. Specifically, the second input protection circuit 4 consists of a p-channel MOS transistor Qp3 and an n-channel MOS transistor Qn3, wherein each of those MOS transistors acts like a diode. The power-supply terminals $VDD_1$ and $VSS_1$ are respectively connected to the sources of the MOS transistors Qp3 and Qn3.

The second input protection circuit 4 works as similar to the first input protection circuit 2 so that the electric currents, corresponding to the abnormal voltage input, are released by the operations of the parasitic components which apparently emerge therein in response to the abnormal voltage input. When the abnormal voltage input creates a sharp potential variation which cannot be absorbed by the first input protection circuit 2, the second input protection circuit 4 is activated so that the potential variation at the common gate terminal G is followed by the potential variation at the power-supply terminals $VDD_1$ and $VSS_1$; hence, the destruction or deterioration of the gate of the MOS transistor in the primary-stage inverter circuit 1 can be avoided.

In the present embodiment shown in FIG. 2, both of the input protection circuits 2 and 4 are configured by the MOS transistors. Therefore, the present embodiment is advantageous in that a change in the manufacturing process of the internal circuit is not required.

The scope of the invention is not limited by the aforementioned embodiments. In the embodiments described heretofore, the present invention is applied to the MOS integrated circuit in which the inverter circuit, configured by the MOS transistors, is employed for the primary stage of the internal circuit. However, the present invention can be applied to another semiconductor device or the like in which another type of inverter circuit, such as the E/E type and E/D type, is employed for the primary stage of the internal circuit.

Lastly, this invention may be practiced or embodied in still other ways without departing from the Spirit or essential character thereof as described heretofore. Therefore, the preferred embodiments described herein are illustrative and not restrictive. The scope of the invention being indicated by the appended claims, and all variations which come within the meaning of the claims, are intended to be embraced therein.

What is claimed is:

1. A semiconductor device comprising:
   an internal circuit whose primary stage is configured by a MOS transistor having a gate which receives a voltage input from an input terminal, the internal circuit being connected with a first power-supply terminal connectable to a first power supply;
   a first input protection circuit which is located between the input terminal and the gate of the MOS transistor, the first input protection circuit being connected with a second power-supply terminal connectable to a second power supply which is provided independently of the first power-supply, the first input protection circuit being activated when an abnormal voltage input is applied to the input terminal so that the first input protection circuit performs a voltage clamping by releasing an electric current corresponding to the abnormal voltage input; and a second input protection circuit which is located between the first input protection circuit and the internal circuit and is connected with the first power-supply terminal, the second input protection circuit being activated responsive to the abnormal voltage input applied to the input terminal so that a potential variation at the gate of the MOS transistor which is caused by the abnormal voltage input is followed by a potential variation at the first power-supply terminal.

2. A MOS integrated circuit providing an internal circuit whose primary stage is configured by an inverter circuit consisting of p-channel and n-channel MOS transistors whose gates are connected together to form a common gate terminal and whose sources are connected with a first pair of power-supply terminals connectable to a first power supply, respectively, the common gate terminal receiving a voltage input from an input terminal, the MOS integrated circuit comprising:

a first input protection circuit which is located between the input terminal and the common gate terminal, the first input protection circuit being connected with a second pair of power-supply terminals connectable to a second power supply which is provided independently of the first power-supply, the first input protection circuit being activated when an abnormal voltage input is applied to the input terminal so that the first input protection circuit performs a voltage clamping by releasing an electric current corresponding to the abnormal voltage input; and a second input protection circuit which is located between the first input protection circuit and the common gate terminal and in connected with the first pair of power-supply terminals, the second input protection being activated when the abnormal voltage input is a sharp surge-pulse input so that a potential variation at the common gate terminal which is caused by the abnormal voltage input is followed by a potential variation at the first pair of power-supply terminals.

3. A MOS integrated circuit according to claim 2, wherein the first input protection circuit consists of p-channel and n-channel MOS transistors whose drains are connected together with the input terminal and the common gate terminal, while a source, a gate and a bulk of each of the MOS transistors are connected together with one of the second pair of power-supply terminals so that each of the MOS transistors acts like a diode.

4. A MOS integrated circuit according to claim 2, wherein the second input protection circuit consists of two zener diodes which are connected together in a forward-bias direction, so that one of the zener diodes is turned on in response to a polarity of the abnormal voltage input.

5. A semiconductor device, comprising:

an internal circuit whose primary stage is configured by a MOS transistor having a gate which receives a voltage input from an input terminal, where a first node of the internal circuit is connected with a first power-supply terminal of a first voltage level and a second node of the internal circuit is connected with a second power-supply terminal of a second voltage level;

a first input protection circuit which is located between the input terminal and the gate of the MOS transistor, a first node of the first input protection circuit being connected with a third power-supply terminal of a third voltage level which is provided independently of the first power-supply terminal and a second node of the first input protection circuit being connected with a fourth power-supply terminal of a fourth voltage level, the first input protection circuit being activated when an abnormal voltage input is applied to the input terminal so that the first input protection circuit performs a voltage clamping by releasing an electric current corresponding to the abnormal voltage input; and a second input protection circuit which is located between the first input protection circuit and the internal circuit, a first node of the second input protection circuit being connected with the first power-supply terminal and a second node of the second input protection circuit being connected with the second power-supply terminal, the second input protection circuit being activated responsive to the abnormal voltage input applied to the input terminal so that a potential variation at the gate of the MOS transistor which is caused by the abnormal voltage input is followed by a potential variation at the first power-supply terminal.

6. A MOS integrated circuit providing an internal circuit whose primary stage is configured by an inverter circuit consisting of p-channel and n-channel MOS transistors whose gates are connected together to form a common gate terminal and whose sources are connected with a first pair of power-supply terminals having different voltage levels, the common gate terminal receiving a voltage input from an input terminal, the MOS integrated circuit comprising:

a first input protection circuit which is located between the input terminal and the common gate terminal, the first input protection circuit being connected with a second pair of power-supply terminals having different voltage levels independent of the voltage level between the first pair of power-supply terminals, the first input protection circuit being activated when an abnormal voltage input is applied to the input terminal so that the first input protection circuit performs a voltage clamping by releasing an electric current corresponding to the abnormal voltage input; and a second input protection circuit which is located between the first input protection circuit and the common gate terminal and in connected with the first pair of power-supply terminals, the second input protection being activated when the abnormal voltage input is a sharp surge-pulse input so that a potential variation at the common gate terminal which is caused by the abnormal voltage input is followed by a potential variation at the first pair of power-supply terminals.

7. A MOS integrated circuit according to claim 6, wherein the first input protection circuit consists of p-channel and n-channel MOS transistors whose drains are connected together with the input terminal and the common gate terminal, while a source, a gate and a bulk of each of the MOS transistors are connected together with one of the second pair of power-supply terminals so that each of the MOS transistors acts like a diode.

8. A MOS integrated circuit according to claim 6, wherein the second input protection circuit consists of two zener diodes which are connected together in a forward-bias direction, so that one of the zener diodes is turned on in response to a polarity of the abnormal voltage input.

* * * * *